United States Patent [19]

Nakamura

[11] Patent Number: 4,661,771
[45] Date of Patent: Apr. 28, 1987

[54] METHOD OF SCREENING RESIN-SEALED SEMICONDUCTOR DEVICES

[75] Inventor: Kazuo Nakamura, Yokohama, Japan

[73] Assignee: Fujitsu Limited, Kawasaki, Japan

[21] Appl. No.: 535,964

[22] Filed: Sep. 23, 1983

[30] Foreign Application Priority Data

Sep. 28, 1982 [JP] Japan ................... 57-168933

[51] Int. Cl.⁴ .......................................... G01R 31/26
[52] U.S. Cl. ......................... 324/158 D; 324/158 R
[58] Field of Search .......... 324/158 D, 158 R, 158 T; 29/574; 374/45, 50, 57

[56] References Cited

U.S. PATENT DOCUMENTS 3,659,199  4/1972  Knutson ................... 324/158 D

FOREIGN PATENT DOCUMENTS 2818080  11/1978  Fed. Rep. of Germany .
3037192   5/1982  Fed. Rep. of Germany .

OTHER PUBLICATIONS

AEG Mittelilungen, vol. 54, No. 5/6, 1964, Berlin G. Kubitzki, "Prufung von Silizium-Halbleiterbauerlementen, pp. 466–467.
Patent abstracts of Japan, vol. 6, No. 25, Feb. 13, 1982 and JP-A-56-146255.

Primary Examiner—Ernest F. Karlsen
Attorney, Agent, or Firm—Armstrong, Nikaido, Marmelstein & Kubovcik

[57] ABSTRACT

A method of screening resin-sealed semiconductor devices having a resin body for sealing and a semiconductor chip is mounted on a die stage having a first and second bars, said first and second bars extending from said die stage to opposite side surfaces of the body and having a first and second ends exposed to said side surfaces, which method comprises the steps of applying electric voltage between said first and second ends to heat the semiconductor chip, and subjecting the device to screening test.

4 Claims, 8 Drawing Figures

METHOD OF SCREENING RESIN-SEALED SEMICONDUCTOR DEVICES

BACKGROUND OF THE INVENTION

1. Field of the Invention

The invention relates to a method of screening resin-sealed semiconductor devices or packages. More particularly, the invention relates to a method for removing resin-sealed semiconductor devices showing abnormal functions under a high temperature environment or having packaging faults in a delivery inspection.

2. Description of the Prior Art

Resin-sealed semiconductor packages have the advantage of low cost and have been used widely for integrated circuits, large scale integrations and the like through the recent development of the passivation technique. On the other hand, the resin material itself are likely to have delicate shades of properties between lots as being susceptible to external factors, particularly heat and temperature. Therefore, the failure rate of the resin-sealed semiconductor packages as applied to actual usage is susceptible to the difference in lots or use conditions, and thus, the reliability test of the devices is important and increases the production cost of the packages. In addition, in the mass production of the resin-sealed semiconductor packages, even if the design is suitable and the process control is effectively carried out, there may be produced some defective devices. Therefore, in general, high temperature test for removing devices showing normal functions at a usual temperature but abnormal functions under a high temperature environment is carried out as a measure of screening for finding out the defective devices.

Conventionally, such high temperature test has been carried out by a process as illustrated in FIG. 1, wherein the packages are shipped after being passed through a set-up step 1, a heating step 2, an operation test step 3 and then a screening step 4. The packages are set up at the set-up step 1 and forwarded to the heating step 2. At the heating step, the packages are placed on a heating plate heated to a constant temperature so that the surface temperature of the packages reaches a prescribed high temperature, e.g., 70° C. Then, the packages are taken out while being kept to the temperature and forwarded to the test step 3, at which each of the packages is determined if it correctly operates at the temperature by subjecting it to operation test by direct or alternating current or to functional test. Then, at the screening step 4, defective packages are removed.

However, in such a conventional process, the packages to be tested at the test step 3 may often have different surface temperatures so that the test result can not have a high reliability. Further, in such a process, defective devices having packaging faults such as having voids in the resin layer or having a chip incompletely mounted on the die stage of the package can not be screened.

SUMMARY OF THE INVENTION

It is the primary object of the present invention to provide a method of screening resin-sealed semiconductor devices, which can attain results of high reliability and is capable of removing defective devices showing abnormal functions under a high temperature environment as well as those having packaging faults.

Thus, the present invention provides a method of screening resin-sealed semiconductor devices having a resin body for sealing and a semiconductor chip mounted on a die stage having a first and second bars, said first and second bars extending from said die stage to opposite side surfaces of the body and having a first and second ends exposed to said side surfaces, which method comprises the step of applying electric voltage between said first and second ends to heat the semiconductor chip, and subjecting the device to screening test.

DESCRIPTION OF THE PREFERRED EMBODIMENTS

Figure 2:
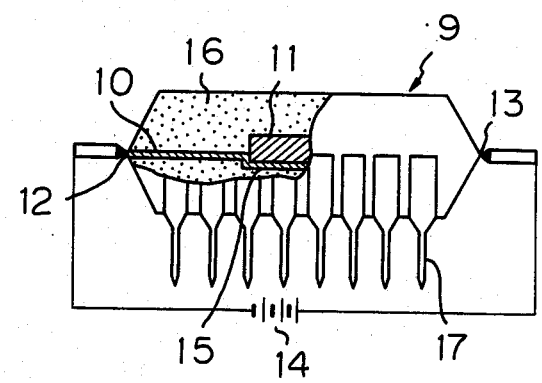
FIG. 2 is a schematical view illustrating the step for applying electrical voltage to the tie bar ends according to the process of the invention.

Referring to FIG. 2, a resin-sealed semiconductor device 9 to be tested is applied with a direct current voltage from a power source 14 to the ends 12, 13 of bars 10 extended from a die stage 15. The bars 10 is a part which had connected the die stage to the frame part of a lead frame which had been used for the preparation of the resin-sealed semiconductor device. Thus, the semiconductor chip 11 sealed by a resin layer 16 is heated to a constant temperature by Joule's heat generated from the bars 10 and the die stage 15.

Figure 3A:
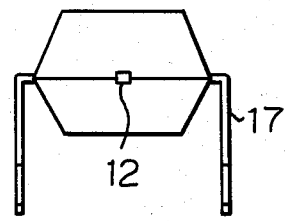
FIGS. 3A through 3C are schematical views illustrating a resin-sealed semiconductor device.
Figure 3B:
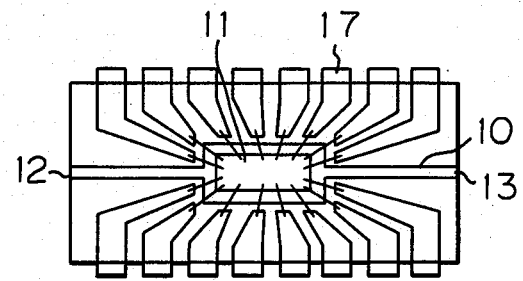
Figure 3C:
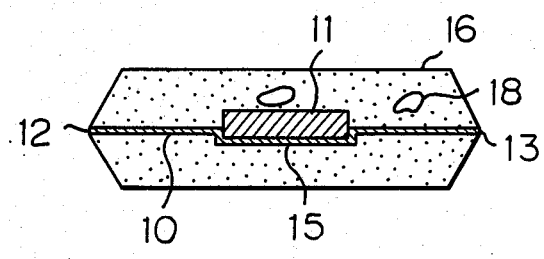

For better understanding, the resin-sealed semiconductor device 9 as shown in FIG. 2 is illustrated in detail in FIGS. 3A through 3C. FIG. 3A is a side view of the device 9, FIG. 3B is a top perspective view thereof, and FIG. 3C is a cross-sectional front view thereof. The semiconductor chip 11 is mounted on the die stage 15 having the bars 10 and connected to leads 17 with wires. The bars 10 are extended from the die stage 15 to the opposite side surfaces of the device 9 so that the ends 12, 13 are exposed to the side surfaces. The semiconductor device 9 is sealed by the sealing resin layer 16. In this connection, the resin layer 16 may contain voids 18.

Figure 1:
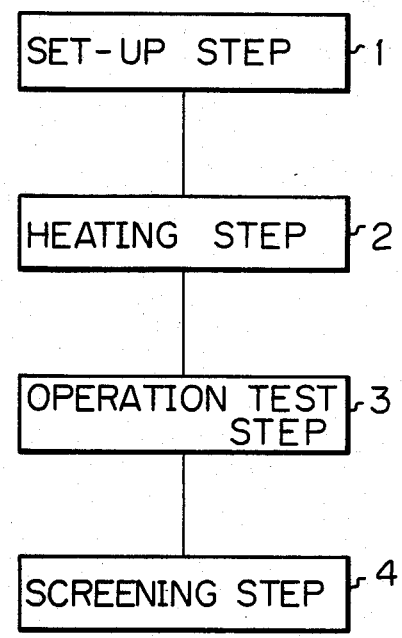
FIG. 1 is a flow sheet for illustrating a conventional screening method.

According to the present invention, the heating step 2 shown in FIG. 1 can be carried out only by applying electric voltage between the ends 12, 13 exposed to the package side surfaces. Therefore, since it is not necessary to provide a heat plate and the like as in a conventional test apparatus, the test apparatus can easily be made compact.

Further, according to the present invention, in addition to the easy heating of the semiconductor devices, it is possible to screen the defective devices having voids in the resin layer or having an incompletely mounted chip. That is, it is possible to screen the defective devices having packaging faults by inspecting the temperature of the semiconductor chip being heated. For example, the speed of the temperature rise of the semiconductor chip in a constant period of time is larger in the devices having voids in the resin layer as compared with those having no void, since the heat load to the die stage 15 and bars 10 of heating sources becomes low in the devices having voids. On the other hand, if the semiconductor chip is incompletely mounted on the die stage, the speed of the temperature rise of the semiconductor chip becomes smaller as compared with the devices having a completely mounted chip, since the efficiency of the heat conduction from the die stage to the semiconductor chip becomes low in the devices having an incompletely mounted chip. In this way, the internal defects, such as the presence of voids or the incomplete mounting of a chip, of the resin-sealed semiconductor devices can be detected.

Figure 4:
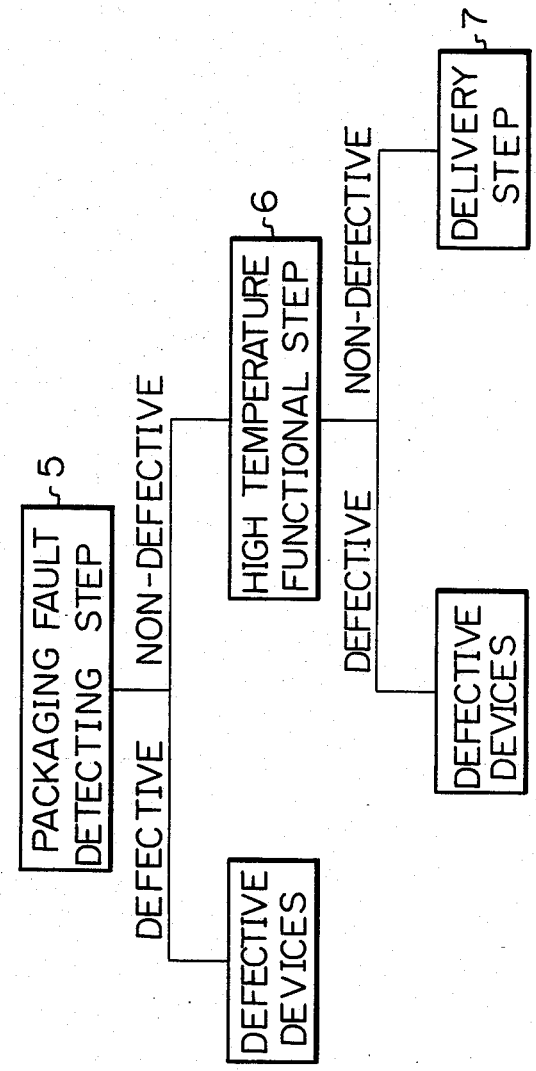
FIG. 4 is a flow sheet for illustrating an example of the screening method of the present invention.

A screening method including a step for screening defective devices having such packaging faults is shown in FIG. 4. The devices passed a functional test at a usual temperature is applied with electric voltage to be heated at a step 5 for detecting packaging faults, at which step devices showing abnormal temperature rise are judged to be defective. Non-defective devices passed the step 5 are again with electric voltage to the ends of the bars 10 to be heated to a prescribed temperature, and at the temperature, a high temperature functional test is carried out, at a high temperature functional test step 6. The temperature of the semiconductor chip can easily be set as mentioned hereinafter. Then only devices judged to be non-defective at the step 6 are delivered at a delivery step 7. Thus, according to the present invention, only highly reliable devices showing normal functions even under a high temperature environment and having no packaging fault can be delivered.

Figure 5:
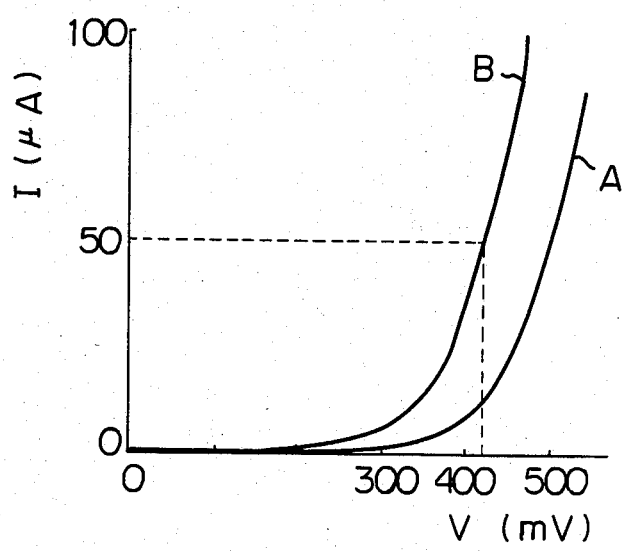
FIG. 5 is a graph illustrating a relationship between electrical current and electrical voltage when an electrical current is passed through the semiconductor chip of a resin-sealed semiconductor device.

The temperature change of the semiconductor chip 11 may be detected by an electrical means. That is, the temperature change can be detected by measuring the voltage in the forward direction of the PN junction of the semiconductor chip. That is to say, if an electric current flows in the forward direction of the PN junction by applying an electric voltage between a ground pin and another pin of a divece to which an electric voltage is otherwise applied between the ends 12, 13 of the bars 10, the electric voltage in the forward direction varies depending on the temperature of the semiconductor chip, and thus, the temperature of the semiconductor chip can be detected. For example, as shown in FIG. 5, in the case of applying an electric voltage to the bars 10 for a constant period of time, if an electric current (I) of 50 $\mu$A is passed through the semiconductor chip, an electric voltage (V) of about 420 mV is detected in the forward direction of the PN junction where the device has a correct temperature, i.e., the device has no defect. In this case, if the detected voltage is in a range of from 380 to 460 mV, the tested device may have no defect.

The graph in FIG. 5 was obtained using a curve tracer for a resin-sealed semiconductor device of 16 pins which had a die stage of an iron-nickel alloy. The curve A was obtained when no electric current was applied to the bars 10 and the curve B was obtained when an electric current of 5A was applied to the bars 10 for 60 sec. Therefore, if a non-defective device exhibits the curve B as shown in FIG. 5, the forward direction voltage of a defective device having voids is lower than 420 mV when an electric current of 50 $\mu$A is passed through the semiconductor chip to the forward direction of the PN junction in the case where an electric voltage is applied to the bars 10 for a prescribed period of time, since the temperature rise of the chip is rapid. On the other hand, the forward direction voltage of a defective device having an incompletely mounted chip is higher than 420 mV, since the temperature rise of the chip is slow.

Of course, according to the invention, a resin-sealed semiconductor device having a high temperature fault can also be detected by heating the device through the above-mentioned application of an electric voltage to the bar ends and subjecting the heated device to operation test by direct or alternating current or to functional test.

Figure 6:
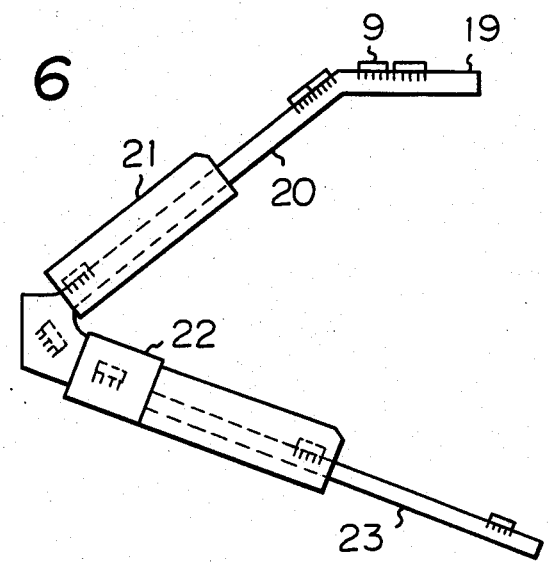
FIG. 6 is a schematical view illustrating an embodiment of the screening method of the present invention.

The method of the present invention can easily be effected, for example, by applying the step of the application of an electric voltage to a conventional automatic tester as illustrated in FIG. 6. The resin-sealed semiconductor devices 9 are placed on a package stage 19 and then slipped down onto the surface of an upper arm 20 one by one to reach the heating stage 21. In the heating stage 21, the step of the application of an electric voltage is combined, and the devices is applied with an electric voltage to the bar ends to be heated to a constant temperature, e.g., 70° C. In this stage, defective devices having voids or an incompletely mounted chip may be detected as mentioned hereinabove. Then, the heated devices are forwarded to the next stage 22 successively one by one and at the stage 22 they are subjected to an operation test or functional test to detect high temperature faults. The test stage 22 may be heated to the prescribed constant temperature to maintain the temperature of the heated devices. Thereafter, the devices are taken out through a lower arm 23 and screened.

I claim:

1. A method of screening a resin-sealed semiconductor device, said semiconductor device comprising a semiconductor chip, a resin body for sealing said semiconductor chip, a die stage wherein said semiconductor chip is mounted on said die stage, and first and second bars connected to said die stage extending from said die stage to opposite side surfaces of the body, said first and second bars having first and second exposed ends, said method comprising the steps of applying an electric voltage between said first and second ends of said first and second bars wherein said die stage is heated and thereby said semiconductor chip is heated, and subjecting the device to a screening test by inspecting the rate of temperature rise of said semiconductor chip.

2. A method as claimed in claim 1, including performing a functional test of the semiconductor chip during the screening test step.

3. A method as claimed in claim 1, including removing devices exhibiting an electric voltage in the forward direction of the PN junction outside a prescribed range when an electric current is passed through the PN junction of the semiconductor chip and the semiconductor chip is heated for a prescribed period of time during the screening test step.

4. A method as claimed in claim 1, including controlling the electric voltage applied between said first and second ends such that an electric voltage in the forward direction of the PN junction becomes equal to a prescribed value when an electric current is passed through the PN junction of the semiconductor chip.

* * * * *